United States Patent

Ogawa et al.

Patent Number: 6,153,107
Date of Patent: Nov. 28, 2000

[54] PROCESS FOR TREATING DEVELOPMENT WASTE LIQUOR

[75] Inventors: Nobuo Ogawa; Tsutomu Kojima; Shin Ashizuka, all of Fuji, Japan; Andre Dheur, Liege, Belgium

[73] Assignee: Asahi Kasei Kogyo Kabushiki Kaisha, Osaka, Japan

[21] Appl. No.: 09/132,507

[22] Filed: Aug. 11, 1998

[30] Foreign Application Priority Data

Aug. 14, 1997 [JP] Japan ................................... 9-219413
Aug. 15, 1997 [JP] Japan ................................... 9-220538

[51] Int. Cl.[7] .................................................. B01D 21/00
[52] U.S. Cl. ............................................ 210/710; 210/748
[58] Field of Search .................................... 210/748, 712, 210/738, 702, 724, 725, 710

[56] References Cited

U.S. PATENT DOCUMENTS

| 5,124,736 | 6/1992 | Yamamoto et al. | 210/251 |
| 5,133,932 | 7/1992 | Gunn et al. | 210/748 |
| 5,194,583 | 3/1993 | Krulik | 528/485 |
| 5,540,848 | 7/1996 | Engelhard | 210/748 |

FOREIGN PATENT DOCUMENTS

| 02 54550A1 | 1/1988 | European Pat. Off. |
| 06 24828A1 | 11/1994 | European Pat. Off. |
| 44 42712C1 | 3/1996 | Germany |
| 53-094261 | 8/1978 | Japan |
| 53-94261 | 8/1978 | Japan |
| 54-051253 | 4/1979 | Japan |
| 59-169590 | 9/1984 | Japan |

OTHER PUBLICATIONS

IBM Technical Disclosure Bulletin, vol. 22, No. 4, p. 1414, Sep. 1979 (XP–002084040).

*Primary Examiner*—Duane Smith
*Assistant Examiner*—Frank M. Lawrence
*Attorney, Agent, or Firm*—Birch, Stewart, Kolasch & Birch, LLP

[57] ABSTRACT

A process for treating a development waste liquor containing a photosensitive resin and a surface active agent, which includes subjecting the waste liquor to a treatment for diminishing the efficacy of the surface active agent, thereby separating the resin component from the development waste liquor, thereafter irradiating the development waste liquor with an ultraviolet ray having a wavelength of 300 to 400 nanometers to cure the resin component in the development waste liquor, and then removing the resulting solids.

18 Claims, 1 Drawing Sheet

PROCESS FOR TREATING DEVELOPMENT WASTE LIQUOR

BACKGROUND OF THE INVENTION

1. Field of the Invention

This invention relates to a process for removing the solid content (water-dispersible resin and the like) in a development waste liquor generated in the course of the printing plate making process using a photosensitive resin, particularly a liquid photosensitive resin printing plate and to apparatus for treating the development waste liquor.

2. Description of the Related Art

The development step carried out in the printing plate making process using a photosensitive resin is a step in which the photosensitive resin plate, the exposure of which has been completed, contacts an aqueous developer comprising a surface active agent as the main component by brushing, spraying or the like to dissolve the resin of the unexposed portion in the developer, thereby converting the latent image in the exposed portion to a visible image.

During repeating the above-mentioned development, the concentration of the resin dispersed in the developer increases, and when it reaches 2 to 4% by weight, the capacity of the developer deteriorates and causes problems such as uncured resin reattaching to the plate surface to deteriorate the quality of the printed image, make the development time remarkably long, and the like. Therefore, it becomes necessary to discharge the deteriorated developer and substitute therefor a fresh developer.

The development waste liquor thus discharged contains a photosensitive resin, a surface active agent (dispersing agent), a defoaming agent and the like, and the COD (chemical oxygen demand) becomes at least 5,000 mg/liter by the above materials.

As a general method for the treatment of the above development waste liquor, various techniques are known. However, as stated below, they are not sufficient as a method for easily and effectively removing the resin component contained in the development waste liquor.

(1) Flocculation

The resin component is precipitated by adding a complexing agent. However, the resin component is not solidified and hence care must be given to the handling of the ooze-like sediments.

(2) Ultrafiltration and Reverse Osmosis

The resin component in the development waste liquor tends to cause blocking of a membrane, and in some cases, the membrane life is remarkably shortened unless the solid content has previously been removed by flocculation or the like. When any of ultrafiltration and reverse osmosis is used alone, it is necessary to pay attention to the membrane life.

(3) Distillation

A high energy is necessary for the latent heat of vaporization of water, and the operating cost is high. Moreover, the solidified resin to be separated from the water content during evaporation blocks the evaporation piping and hence the heat transfer efficiency tends to be lowered. Accordingly, even in the case of this method, the removal of the resin component is considered to become necessary as a pretreatment.

(4) Incineration

The energy cost due to the latent heat of vaporization of water is high, similar to the above-mentioned distillation.

(5) Electrolysis

After the electrolysis, filtration is further necessary, and it follows that the treatment apparatus requires an electrolysis means and a filtration means (filter press or the like). Therefore, the apparatus cost becomes high.

Moreover, the filtered resin component is in the form of a sticky polluted sediment, so that care must be given to the handling of the same.

(6) Photo-oxidation

The development waste liquor is irradiated with an ultraviolet ray; however, when the ultraviolet irradiation is conducted in the state that the resin is dispersed, it is difficult to solidify the resin component in the development waste liquor and the precipitated resin component re-floats easily, and hence, attention should be paid to the filtration of the same.

As described above, if there is a method which can effectively separate the resin component dispersed in development waste liquor and by which the solidified resin component can be easily handled with inexpensive apparatus, such a method is effective as a pretreatment of the waste liquor treatment including ultrafiltration, reverse osmosis, electrolysis and the like.

This invention aims at solving the above-mentioned problems in the prior art and it is an object of this invention to provide a process for treating a development waste liquor by which the resin component contained in the waste liquor can be separated easily.

Another object of this invention is to provide apparatus for treating a development waste liquor.

Other objects and advantages of this invention will become apparent from the following description.

SUMMARY OF THE INVENTION

This invention includes the following:

(i) A process for treating a development waste liquor comprising a photosensitive resin and a surface active agent, which comprises subjecting the development waste liquor to a treatment for diminishing the efficacy of the surface active agent, thereby separating the resin component from the development waste liquor, thereafter irradiating the development waste liquor with an ultraviolet ray having a wavelength of 300 to 400 nanometers to cure the resin component in the development waste liquor and then removing the resulting solids. As the means for removing the resulting solids, filtration is preferable.

(ii) A process for treating a waste liquor generated in the step of the development of a photosensitive resin printing plate, which comprises heating the waste liquor which has dissolved therein a photosensitive resin and contains a nonionic surface active agent to a temperature not lower than the clouding point of the nonionic surface active agent, thereby separating the resin component from the waste liquor, thereafter irradiating the waste liquor with an ultraviolet ray having a wavelength of 300 to 400 nanometers and subsequently removing the resulting solids. As the means for removing the resulting solids, filtration is preferable.

(iii) A process for treating a waste liquor generated in the step of the development of a photosensitive resin printing plate, which comprises adding a flocculating agent to the waste liquor which has dissolved therein a photosensitive resin and contains an anionic surface active agent, thereby separating the resin component from the waste liquor, then irradiating the waste liquor with an ultra-violet ray having a wavelength of 300 to 400 nanometers and subsequently removing the resulting solids. As the means for removing the resulting solids, filtration is preferable.

In the above processes, when the nonionic surface active agent or anionic surface active agent and a liquid photosensitive resin comprising a prepolymer having reactive double bonds at its ends (ex. unsaturated invention is particularly exerted.

(iv) An apparatus for treating a development waste liquor comprising a photosensitive resin and a surface active agent, which comprises a waste liquor treatment tank equipped with a heating means, a stirring means, and ultraviolet-irradiating means and a filtering means.

PREFERRED EMBODIMENTS OF THE INVENTION

Figure 1:
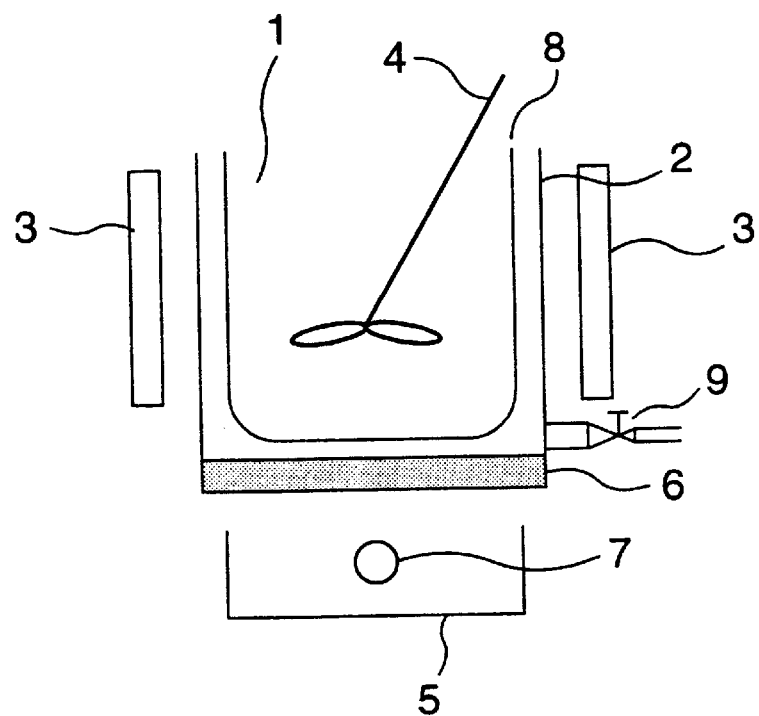
FIG. 1 is a schematic diagram of apparatus showing one mode for carrying out this invention.

In the process for treating a development waste liquor containing a photosensitive resin and a surface active agent of this invention, first of all, a treatment for diminishing the efficacy of the surface active agent is carried out. However, this treatment is varied depending upon the king of the surface active agent used. Specifically, the treatment is varied depending upon nonionic surface active agent or anionic surface active agent.

(1) The Case of use of Nonionic Surface Active Agent

The deteriorated developer comprising the resin component and the nonionic surface active agent is transferred to the waste liquor treatment tank. Then the developer is heated to a temperature not lower than the clouding point of the surface active agent at which the temperature the efficacy of the surface active agent is diminished, upon which the dissolved resin is flocculated and precipitated (the specific gravity of the resin is 1 or more) or floats (the specific gravity of the resin is less than 1). The resin in this state contains an unreacted photoreactive group and can be solidified and made insoluble in the developer by irradiation with an ultraviolet ray in the subsequent step.

(2) The Case of use of Anionic Surface Active Agent

The deteriorated developer comprising the resin component and the anionic surface active agent is transferred to the waste liquor treatment tank and a polyvalent metal ion is added to the developer. The resulting mixture is stirred to flocculate and precipitate the resin component. As a flocculating agent to be used in this invention, there are mentioned various materials such as polyvalent metal ions, macromolecular flocculating agents, acids which lower the pH to diminish the dispersing effect of the surface active agent, and the like. Among them, the polyvalent metal ions are preferred, and among the polyvalent metal ions, alkaline earth metal salts such as calcium sulfate, calcium chloride, magnesium sulfate, magnesium chloride and the like are the most preferable ones because they have such characteristics that the flocculating effect is great, the development waste liquor is made neutral within the pH range of 7 to 8, and no neutralization work is necessary.

(3) The Case of use of a Surface Active Agent Containing a Nonionic One and Anionic One The deteriorated developer containing the resin component is transferred to the waste liquor treatment tank, and heated to a temperature not lower than the clouding point of the nonionic surface active agent at which temperature the efficacy of the nonionic surface active agent is diminished, and in this state, a flocculating agent for diminishing the efficacy of the anionic surface active agent is added thereto and the resulting mixture is stirred, whereby the resin component can be separated.

The resin separated by the above-mentioned steps is irradiated with an ultraviolet ray having a wavelength of 300 to 400 nanometers (fluorescent lamp, mercury lamp, metal halide lamp or the like), upon which the resin containing an unreacted, ultra-violet-functional group is reacted with the ultra-violet ray, whereby the resin is solidified and made insoluble in the developer.

Upon irradiation with an ultra-violet ray, when the specific gravity of the photosensitive resin to be developed is less than 1, the resin component comes to float on the surface of the developer, so that it is preferable to irradiate the developer with the ultraviolet ray from a position above the surface of the developer. On the other hand, when the specific gravity of the photosensitive resin is 1 or more, the bottom of the waste liquor treatment tank is fitted with glass and the developer is irradiated with the ultra-violet ray through the glass, whereby the precipitated resin can be cured efficiently.

EXAMPLE 1

A liquid photosensitive resin comprising unsaturated polyurethane prepolymer [APR (a registered trade mark) type K-11 (manufactured by Asahi Kasei Kogyo K. K.)] was exposed to light using an ALF 213E exposing machine (manufactured by Asahi Kasei Kogyo K.K.) and thereafter developed with a developer prepared by dissolving in warm water 2% by weight of APR (a registered trade mark) washing-out agent W6 (manufactured by Asahi Kasei Kogyo K. K.) of a nonionic surface active agent and a silicon type defoaming agent in an ALF 200W washing machine (manufactured by Asahi Kasei Kogyo K.K.).

Ten plates were subjected to the above exposure and the above development using the above developer as it was. From about the time when the concentration of the dissolved resin in the developer became 2% by weight, the resin component dissolved in the developer started re-attaching to the surface of the plate, so that the working development was stopped.

The above deteriorated developer was transferred red to a tank equipped with a heater and heated to 70° C., In this state, this developer was irradiated with light from a 20-W fluorescence lamp fixture manufactured by TOSHIBA CORP. (peak wavelength: 370 nm) and light from a 30-W germicidal lamp (peak wavelength: 254 nm) to give the developer an energy of 1,000 mJ/cm$^2$ (irradiated for about 10 minutes), and thereafter the developer was allowed to stand.

Thereafter, the floating resin solids [APR (a registered trade mark) type K11 had a specific gravity of 0.85] were removed through a filter. The resin component thus obtained was placed in a transparent polyethylene bag and allowed to stand in sunlight for several days, upon which the resin component was completely solidified.

On the other hand, the developer freed of the resin component was able to be re-used as a developer after APR (a registered trade mark) washing-out agent W6 and a defoaming agent were additionally added.

EXAMPLE 2

A liquid photosensitive resin comprising unsaturated polyurethane prepolymer [APR (a registered trade mark) type F-300 (manufactured by Asahi Kasei Kogyo K. K.)] was exposed to light using an AWF 110E exposing machine (manufactured by Asahi Kasei Kogyo K. K.), and thereafter, developed with a developer prepared in an AWF 110 W washing machine by dissolving in warm water 2% by weight of APR (a registered trade mark) Washing-out agent XW 606 of an anionic surface active agent (manufactured by Asahi Kasei Kogyo K. K.), and a silicon type defoaming agent.

Ten plates were subjected to the above exposure and the above development using the above developer as it was. From about the time when the concentration of the resin dissolved in the developer became 2% by weight, the dissolved resin component began re-attaching to the surface of a plate, so that the working development was stopped.

This deteriorated developer was transferred to a waste liquor treatment tank and heated to about 70° C., at which 0.1% by weight of magnesium sulfate was added to the waste liquor and the resulting mixture was stirred at 60 rpm for 15 minutes. In this state, the pH was measured to find that it was 7.4 and hence substantially neutral.

After the deteriorated developer was allowed to stand for 3 hours, the precipitated resin was irradiated through the glass of the bottom of the waste liquor treatment tank with light from a 20-W fluorescent lamp fixture manufactured by TOSHIBA CORP. (peak wavelength: 370 nanometers) in an exposure dose of 1,000 mJ/cm$^2$ (irradiated for about 10 minutes), after which the supernatant was discharged. Subsequently, the resin solid content in the form of a sheet was taken out by hand.

Thereafter, the waste liquor treatment tank was connected to an ultrafiltration means to subject the development waste liquor to filtration treatment. As a result, the development waste liquor was treated with neither clogging of the filter nor any other trouble.

An explanation is made below of specific examples of the present apparatus for treating a development waste liquor containing a photosensitive resin and a surface active agent, and a method of use of the apparatus based on the accompanying drawings.

Figure 2:
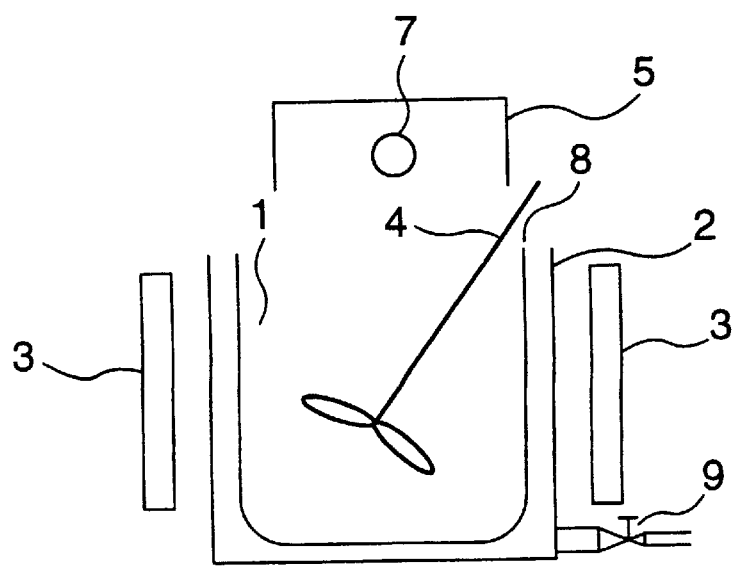
FIG. 2 is a schematic diagram of apparatus showing another mode for carrying out this invention.

FIGS. 1 and 2 are views showing the outline of the treatment apparatus of this invention. The development waste liquor (1) generated by washing and removing the unexposed portion of a photosensitive resin printing plate is sent to a waste liquor treatment tank (2). The waste liquor treatment tank (2) was fitted with a heater (3) as the heating means, a stirrer (revolution speed: 60 to 240 rpm) or a circulating pump (4) as the stirring means and an ultraviolet-irradiation device (5) as the ultraviolet-irradiation means, and a discharge valve (9).

The ultraviolet-irradiation device used in this invention may be such that the bottom of the waste liquor treatment tank is made of glass (6) and the contents of the tank are irradiated with an ultraviolet ray through the glass as shown in FIG. 1 or such that the contents of the waste liquor treatment tank are irradiated with an ultraviolet ray from a position above the tank as shown in FIG. 2.

When the specific gravity of the photosensitive resin is more than 1, the resin component precipitates on the bottom of the waste liquor treatment tank, and hence, the curing of the resin is promoted by irradiating the resin with an ultraviolet ray from the bottom. In this case, the material of the glass used is generally soda-lime glass, sodium borosilicate glass or silica glass.

When the specific gravity of the photosensitive resin is less than 1, the resin component floats on the surface of the waste liquor, and hence, it is preferable to irradiate the resin component from a position above the waste liquor treatment tank. Of course, it is possible to place a water-proof ultraviolet-irradiation device in the waste liquor and irradiate the resin component in the waste liquor with an ultraviolet ray from the device or to use a waste liquor treatment tank having an inner wall made of glass and an outer wall made of glass and irradiate the resin component with an ultraviolet ray from the exterior of the tank.

The ultraviolet-irradiation device has a light source portion (7) and the light source includes fluorescent lamp, a mercury lamp, a metal halide lamp and the like from which lights having a peak wavelength of 300 to 400 nanometers are emitted. When fluorescent lamp is used, there can also be applied a combination of a germicidal lamp from which an ultraviolet ray having a wavelength of about 300 nanometers is emitted, with the fluorescent lamp from which an ultraviolet ray having a wavelength of at least 300 nanometers is emitted.

The irradiation dose of ultra-violet ray is usually 500 to 3,000 mJ/cm$^2$.

The heating means used in this invention is generally an electric heater for direct heating; a warm water heater or an oil heater for indirect heating; or the like. As the heating temperature used in this invention, a temperature not lower than the clouding point of the surface active agent used is considered to be sufficient and a temperature of at least 70° C. is preferable.

The stirring means used in this invention is used for the purpose of dissolving the flocculating agent and making the temperature distribution constant in the waste liquor when the waste liquor is warmed. For this purpose, the waste liquor treatment tank may be fitted with a stirrer (revolution speed: about 60 to 240 rpm) to stir the waste liquor, or the waste liquor in the waste liquor treatment tank may be circulated (about 0.1 to 10 times per minute) by a pump for sending the waste liquor to stir the waste liquor.

As the filtering means (8) used in this invention, a mesh filter may be provided in the interior or outlet of the water liquor treatment tank. In place of the use of the mesh filter, the solidified resin layer may be removed by a jig in the form of a fork. Incidentally, in the case of a photosensitive resin having a specific gravity of less than 1, the resin component floats, and hence, may be picked up with a jig in the form of a mesh.

According to the treatment process of this invention, it becomes possible to easily solidify and separate the dissolved resin in the development waste liquor. Moreover, when the waste liquor treatment apparatus of this invention is used, the resin component can be easily solidified and separated in a treatment tank 1 having a simple structure.

What is claimed is:

1. A process for treating a waste liquor comprising a photosensitive resin and an anionic surface active agent, said process comprising the steps of:

a) providing an apparatus which comprises a waste liquor treatment tank equipped with a heating means, stirring means, an ultraviolet irradiating means and a filtering means;

b) treating the waste liquor to diminish the efficacy of the anionic surface active agent, wherein treating the waste liquor comprises adding a flocculating agent, thereby separating the resin from the waste liquor;

c) irradiating the treated waste liquor with ultraviolet light having a wavelength of about 300 to 400 nanometers, whereby the resin in development waste liquor is cured and solidified; and d) removing the solidified resin.

2. The process for treating a waste liquor according to claim 1, wherein the ultraviolet light is supplied by a fluorescent lamp, mercury lamp or a metal halide lamp.

3. The process for treating a waste liquor according to claim 1, wherein the ultraviolet light is supplied by a lamp having a peak wavelength of about 370 nm and a lamp having a peak wavelength of about 254 nm.

4. The process for treating a waste liquor according to claim 1, wherein the ultra-violet light irradiating the development waste liquor has an energy of about 1,000 mJ/cm$^2$.

5. The process for treating a waste liquor according to claim 1, wherein irradiating the development waste liquor is performed for about 10 minutes.

6. The process for treating a waste liquor according to claim 1, wherein the flocculating agent is selected from the group consisting of polyvalent metal ions, macromolecular flocculating agents and acids.

7. The process for treating a waste liquor according to claim 1, wherein the flocculating agent comprises magnesium sulfate.

8. The process according to claim 1, wherein the waste liquor treatment tank has a glass bottom.

9. The process according to claim 1, wherein the ultraviolet-irradiating means can irradiate through the glass bottom.

10. The process according to claim 1, wherein the ultraviolet-irradiating means can irradiate at about 500 to 3,000 mJ/cm$^2$.

11. The process according to claim 1, wherein the stirring means is a stirrer or a recirculation pump.

12. The process according to claim 11, wherein the stirrer has a revolution speed of about 60 to 240 rpm.

13. The process according to claim 11, wherein the recirculation pump circulates the waste liquor from about 0.1 to 10 times per minute.

14. The process according to claim 1, wherein the heating means is selected from the group consisting of an electric heater, a warm water heater and an oil heater.

15. The process according to claim 1, wherein the filtering means is provided in an interior or an outlet of the waste liquor treatment tank.

16. The process according to claim 1, wherein the filtering means comprises a mesh filter or a jig having a forked form.

17. The process according to claim 8, wherein the glass is selected from the group consisting of soda-lime glass, sodium borosilicate glass and silica glass.

18. The process according to claim 1, wherein the ultraviolet-irradiating means is waterproof and placed in the waste liquor.

* * * * *